(12) United States Patent
Hsu et al.

(10) Patent No.: US 6,654,277 B1
(45) Date of Patent: Nov. 25, 2003

(54) SRAM WITH IMPROVED NOISE SENSITIVITY

(75) Inventors: Louis L. Hsu, Fishkill, NY (US); Rajiv V. Joshi, Yorktown Heights, NY (US); Robert C. Wong, Poughkeepsie, NY (US)

(73) Assignee: International Business Machines Corp., Armonk, NY (US)

( * ) Notice: Subject to any disclaimer, the term of this patent is extended or adjusted under 35 U.S.C. 154(b) by 11 days.

(21) Appl. No.: 10/143,870

(22) Filed: May 14, 2002

(51) Int. Cl.[7] .......................... G11C 11/00; G11C 7/02; G11C 7/00; G11C 8/00
(52) U.S. Cl. ................... 365/154; 365/206; 365/188; 365/230.03; 365/230.06
(58) Field of Search .................... 365/154, 188, 365/206, 230.03, 230.06

(56) References Cited

U.S. PATENT DOCUMENTS 6,005,796 A * 12/1999 Sywyk et al. ............... 365/156
6,486,007 B2 * 11/2002 Chan et al. .................. 438/142

* cited by examiner

Primary Examiner—David Nelms
Assistant Examiner—Ly Duy Pham
(74) Attorney, Agent, or Firm—Law Office of Charles W. Peterson, Jr.; Louis J. Percello

(57) ABSTRACT

A static random access memory (SRAM) with cells in one portion having a higher beta ratio than the remaining cells of the array. In a first portion, cells have a low β ratio for high performance. A second portion of the array contains SRAM cells with a higher β ratio that are more stable than the cells in the first portion, but are somewhat slower.

26 Claims, 10 Drawing Sheets

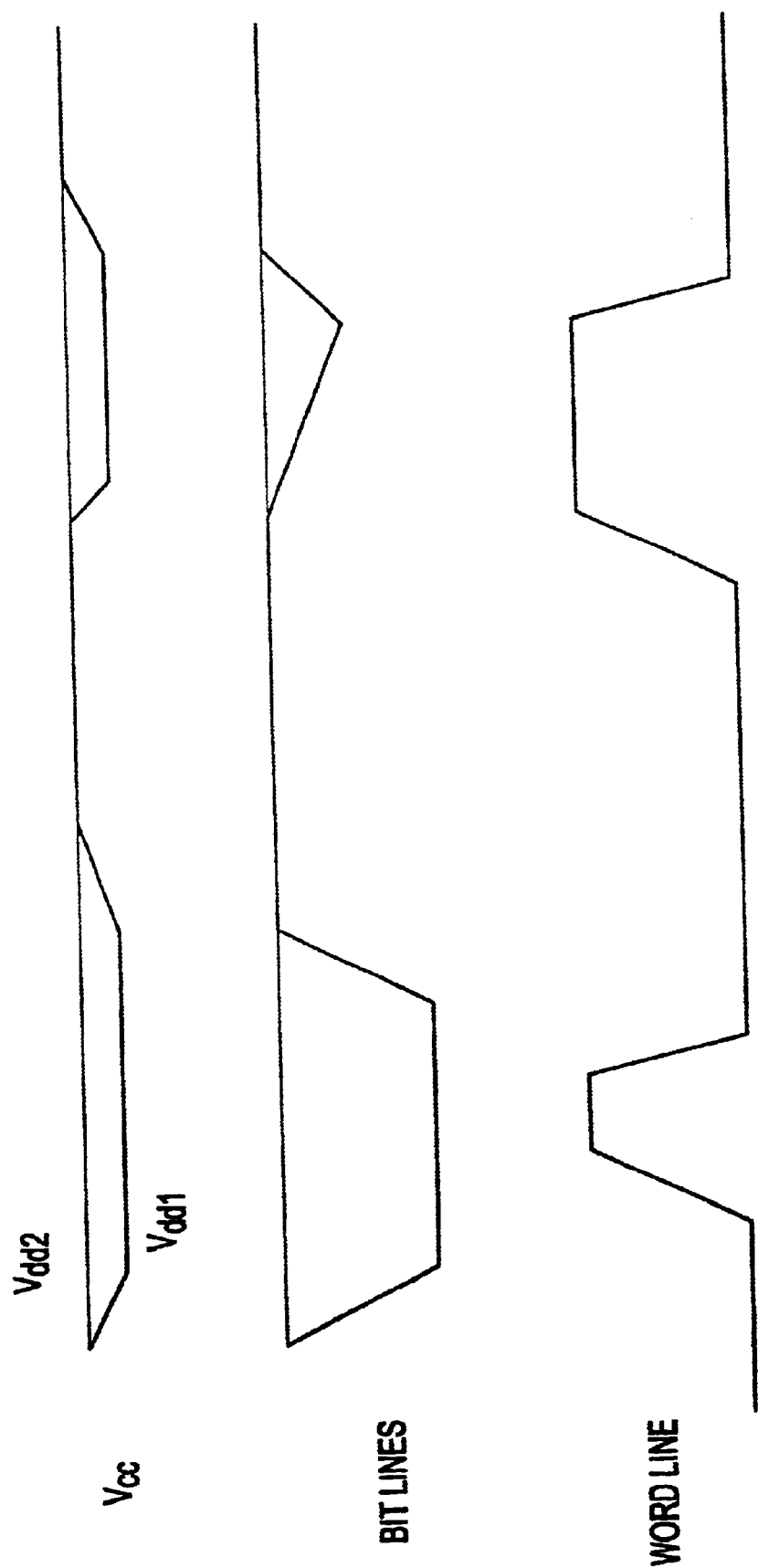

SRAM WITH IMPROVED NOISE SENSITIVITY

BACKGROUND OF THE INVENTION

1. Field of the Invention

The present invention is related to static random access memories (SRAMs) and more particularly to improving noise sensitivity in SRAM cells.

2. Background Description

Invertors made completely of n-type enhancement mode field effect transistors (NFETs) or devices, such as inverter 20 of FIG. 1 are well known in the art. A typical NFET invertor 20 is two series connected NFETs 22, 24. The first NFET 22 is tied gate to drain between a supply voltage ($V_{dd}$) and an output 26. The second NFET 24 is connected drain to source between a low supply or reference voltage (ground, GND) and the output 26. The input 28 to the invertor 20 is provided to the gate of the second NFET 24.

With the input low, both FETs 22, 24 are off and the output is high, below $V_{dd}$ by the NFET threshold voltage ($V_T$), i.e., at $V_{dd}-V_T$. When the input to the invertor 20 is driven high, the second NFET 24 turns on and, at steady state is in its linear or resistive operating range ($R_{on}$), pulling the output 26 low. The first NFET is also on, but in saturation, acting as a voltage controlled current source ($I_{sat}$) The output down level ($V_{low}$) under these conditions is the voltage drop across the resistive second transistor 24 by the current supplied by the voltage controlled current source of the first transistor 22, i.e., $V_{low}=I_{sat}R_{on}$. Calculating these parameters is well known in the art and is dependent upon device operating conditions and numerous technology dependent device characteristics.

Some of these device characteristics, e.g., gate oxide thickness, are common to both transistors 22, 24. However, the individual transistors 22, 24 each have individual device characteristics and bias conditions that affect $V_{low}$, e.g., each device's width to length ratio (W/L), gate, source and drain operating voltages and substrate bias voltage. A typically acceptable output down level is a voltage level that is somewhat less than $V_T$ such that the circuit driven by the invertor output 26 experiences a low, i.e., the next driven NFET does not turn on.

For simplicity in design, since at steady state the output is constant at $V_{low}$ very often each of the NFETs 20, 24 are modeled as resistors (transconductances) in a voltage divider. Accordingly, the output down level may be treated as the voltage from this voltage divider. Further, the ratio of these two transconductances may be referred to as the beta ($\beta$) ratio of the invertor. The $\beta$ ratio can be used to provide a measure of acceptability of the two devices 22, 24 as an invertor, i.e., a "rule of thumb." For example, an invertor with a $\beta$ ratio of 1 has an output down level that is $V_{dd}/2$. An invertor with a $\beta$ ratio of four has an output down level of $0.2V_{dd}$.

FIG. 2 shows an example of a typical state of the art six transistor (6T) static random access memory (SRAM) cell 50, in the well-known complementary insulated gate FET technology known as CMOS. Data is stored in a pair of cross-coupled invertors 52, 54. NFET 52N and p-type FET (PFET) 52P form the first invertor 52. NFET 54N and PFET 54P form the second invertor 54. A pair of pass gates 56, 58 are connected between each of the cross coupled invertors 52, 54 and a respective bit line pair 60, 62. A word line 64, connected to numerous SRAM cells 50, controls the gates of pass gates 56, 58. Typically, the bit line pair 60, 62 are connected to numerous identical SRAM cells 50, each connected to a different word line. The capacitive load for the bit line cells is modeled by a pair of capacitors 66, 68. Each cell 50 is addressed/selected by intersection of the word line 64 at a bit line pair 60, 62.

In a typical SRAM array, a single word line 64 drives pass gates 56, 58 for numerous cells 50, each connected to individual pairs of bit lines 60, 62. Typically, anytime the word line is driven, only a subset of all of the cells at specific selected columns on the word line are of interest. Other cells on the word line at columns other than selected columns are also connected to their bit lines, typically referred to as half selected cells. The half selected cells are connected to their pre-charged bit line pairs with the bit line pairs precharged and floating at $V_{dd}$. Half selected cells should retain data after selection, identically to what is stored in them prior to half selection. A cell disturb, e.g., from incomplete precharge or a design imbalance, cells may switch states.

Data is written into the cell 50 by driving one of the bit line of the pair, 60, 62 high, pulling the other low and, subsequently, driving the word line 64 high for a short period of time. With the word line 64 high, the state of the bit line pair 60, 62 is transferred to cross coupled invertors 52, 54. With the word line 64 low, that state is stored in the cell 50.

Reading data stored in the cell is, more or less, the reverse of a write. First, the bit lines are pre-charged to some bit line pre-charge voltage level ($V_{pre}$), typically $V_{dd}$. After the bit lines are pre-charged, pre-charging the bit line capacitance is 66, 68, the bit lines are floated at the pre-charged and then the word line 64 is driven high. Whatever is stored in the cell, as represented by the respective complementary states of a cross coupled invertors 52, 54, is transferred to the bit lines 60, 62 as a voltage difference. Depending on the state of the cross couple invertors 52, 54, a corresponding bit line 60 or 62, eventually is pulled low and the remaining bit line 62 or 60 remains high. How fast the bit line is pulled low determines cell read time or read performance.

During a read, when the word line 64 turns on, both pass gates 56, 58 connect the cell storage nodes at the cross couple invertors 52, 54 to the bit line pair 60, 62. At least at the beginning of the read with both bit lines of the pair 60, 62 and the word line high, one of the cross coupled invertors 52, 54 (i.e., the invertor driving a low) is biased identically to the NFET inverter 20 of FIG. 1. Thus, cell stability depends on the $\beta$ ratio of the particular pass gate/inverter NFETs 56/52N and 58/54N. Cell performance also depends on the $\beta$ ratio for the pair of NFETs 56, 52N or 58, 54N pulling down the particular bit line 60 or 62 respectively.

Primary concerns of SRAM cell design are cell size, cell performance and cell stability. Cell size is usually a function of the particular geometry or minimum feature size available for the technology in which the cell is being made. Performance and stability are also affected by cell size. To minimize read time and, therefore, optimize performance, the resistance of both pass gates and inverter NFETs (52N, 54N, 56, 58) should be minimized. Typically, invertor NFETs 52N, 54N are a minimum sized devices. So, most read performance is realized by reducing the resistance of pass gates 56, 58. However, reducing the pass gate resistance increases transconductance, reducing $\beta$ ratio and stability, e.g., by increasing the half select voltage drop across the internal cell NFETs 52N, 54N. Further, at some point $\beta$ ratio may be low enough that even minor noise may cause the half selected cell to switch, inadvertently changing data stored in the cell. Generally, the cell beta ratio is selected between two and four, making SRAM cells are more stable and tolerant to noise and other disturbances, e.g., during a cell read. Also, in this β ratio range, the cell remains relatively insensitive to other sources of errors, e.g., alpha-particles or soft errors. Unfortunately, a more stable cell is harder to switch, thus increasing cell write time and also, this stability is at a cost of cell read performance which is not a particularly desirable tradeoff.

Cells with a beta ratio below 1.5 are considered sensitive with disturb occurring in as many as half of cells on a word line. At worst, the disturbs cause half selected cells to change states inadvertently, e.g., from 0 to 1 and vice versa. In particular minor cell mismatches in these sensitive cells, e.g., from poor process control or introduced in cell layout, that might otherwise be tolerable become intolerable at low voltages. So, cell designers are faced with opting for cell stability by keeping the cell β ratios between two and four and suffering long read and write times or, for performance by reducing the cell β ratios to below two and accepting/ suffering the resulting cell sensitivity and instability.

SUMMARY OF THE INVENTION

It is a purpose of the invention to reduce the sensitivity of SRAM cells storing critical data;

It is a further purpose of the invention to improve SRAM cell performance;

It is yet another purpose of the invention to facilitate SRAM operation at low voltages.

The present invention is a static random access memory (SRAM) with cells in one portion having a higher beta ratio than the remaining cells of the array. A first portion, cells have a low β ratio for high performance. A second portion of the array contains SRAM cells with a higher β ratio that are more stable than the cells in the first portion, but are somewhat slower.

BRIEF DESCRIPTION OF THE DRAWINGS

The foregoing and other objects, aspects and advantages will be better understood from the following detailed preferred embodiment description with reference to the drawings, in which:

FIG. 7 is an example of a timing diagram for the reading and writing from a third preferred embodiment array;

DESCRIPTION OF THE PREFERRED EMBODIMENTS

Figure 3:
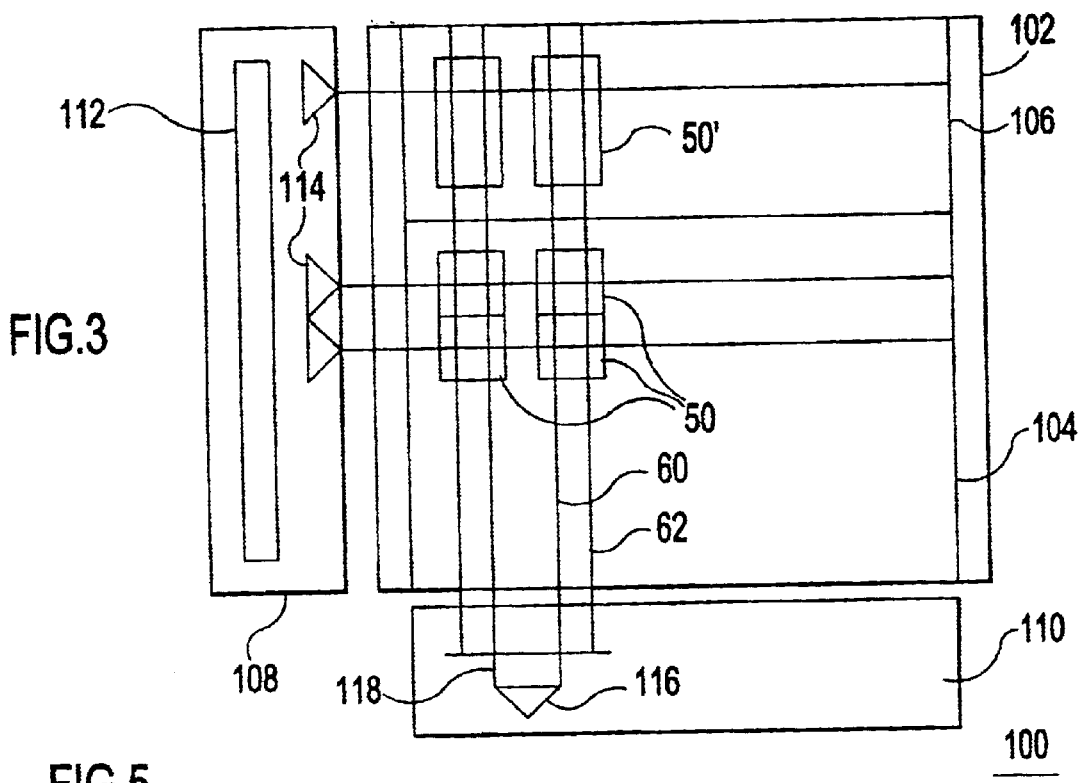
FIG. 3 shows a floor plan of a first preferred embodiment SRAM.

FIG. 3 shows a floor plan of first preferred embodiment SRAM 100 wherein a portion of the SRAM 100 has cells 50' with a higher beta ratio than the remaining cells 50 of the SRAM array 102. In this first embodiment the SRAM array 102 includes a first portion 104 with cells 50 that have a low β ratio for high performance. A second portion 106 of the array 102 contains SRAM cells 50' with a higher β ratio that are more stable than the cells 50 in the first portion 104, but are somewhat slower. A word decode section 108 provides word line selection. A bit decode/sense amp section 110 provides bit line pair selection and data sensing.

As with any typical state of the art SRAM array, the cells 50, 50' in both portions 104, 106 are arranged in rows and columns. Cells 50, 50' in each row share a common word line 64, 64' and, cells 50, 50' in each column share a common bit line pair 60, 62. So, for this preferred embodiment 100, all the cells 50, 50' in both portions 104, 106 array 102 are designed to have a common bit line pitch. Cells 50 in low beta ratio 104 of the array 102, have the same bit line pitch by design and share bit lines 60, 62 with cells 50' in the more stable higher β ratio portion 106. To accommodate for the cells 50' in high beta ratio second portion 106, which are somewhat larger, they have a wider word line pitch than cells 50 in the low beta ratio portion 104. Word line decoders 112 and word line drivers 114 in word decoder section 108 are spaced at a different pitch at the minimum β ratio array portion 104 than at the high β ratio array portion 106, where the word line pitch is greater. Accordingly, there may be gaps between drivers and/or decoders located at the high β ratio array portion 106. If desired, these gaps may be filled with blank or dummy decoders (not shown), for example. Since column/bit line pairs 60, 62 have a uniform pitch throughout the entire array 102, no accommodation is necessary and, sense amps 116 and bit line decoders 118 may be spaced uniformly in bit line/sense amp area 110.

Figure 1:
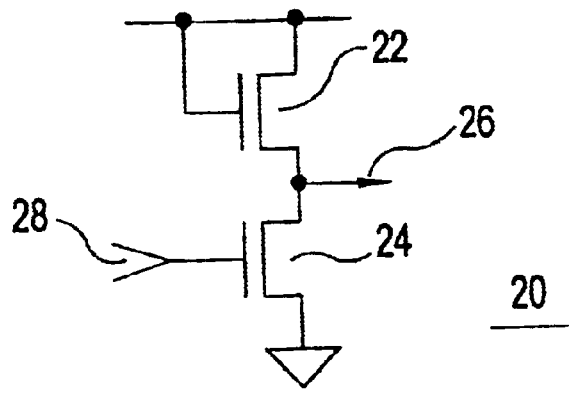
FIG. 1 shows a typical prior art NFET inverter.
Figure 2:
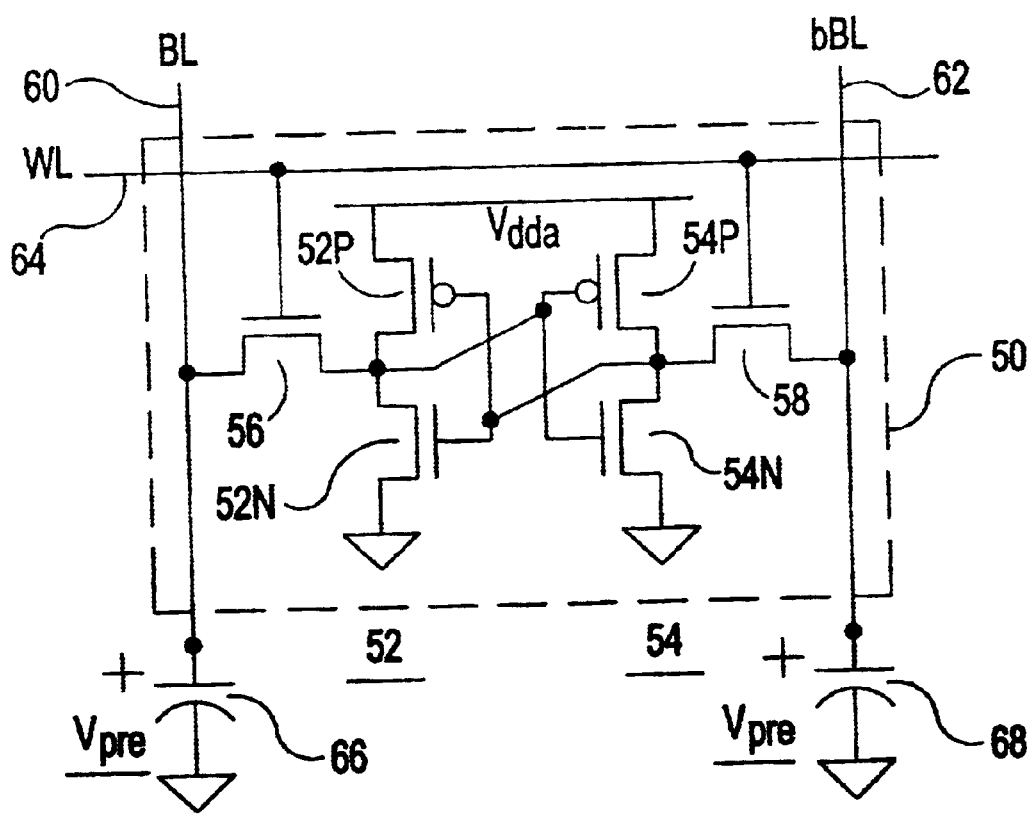
FIG. 2 shows an example of a typical state of the art six transistor (6T) static random access memory (SRAM)
Figure 4A:
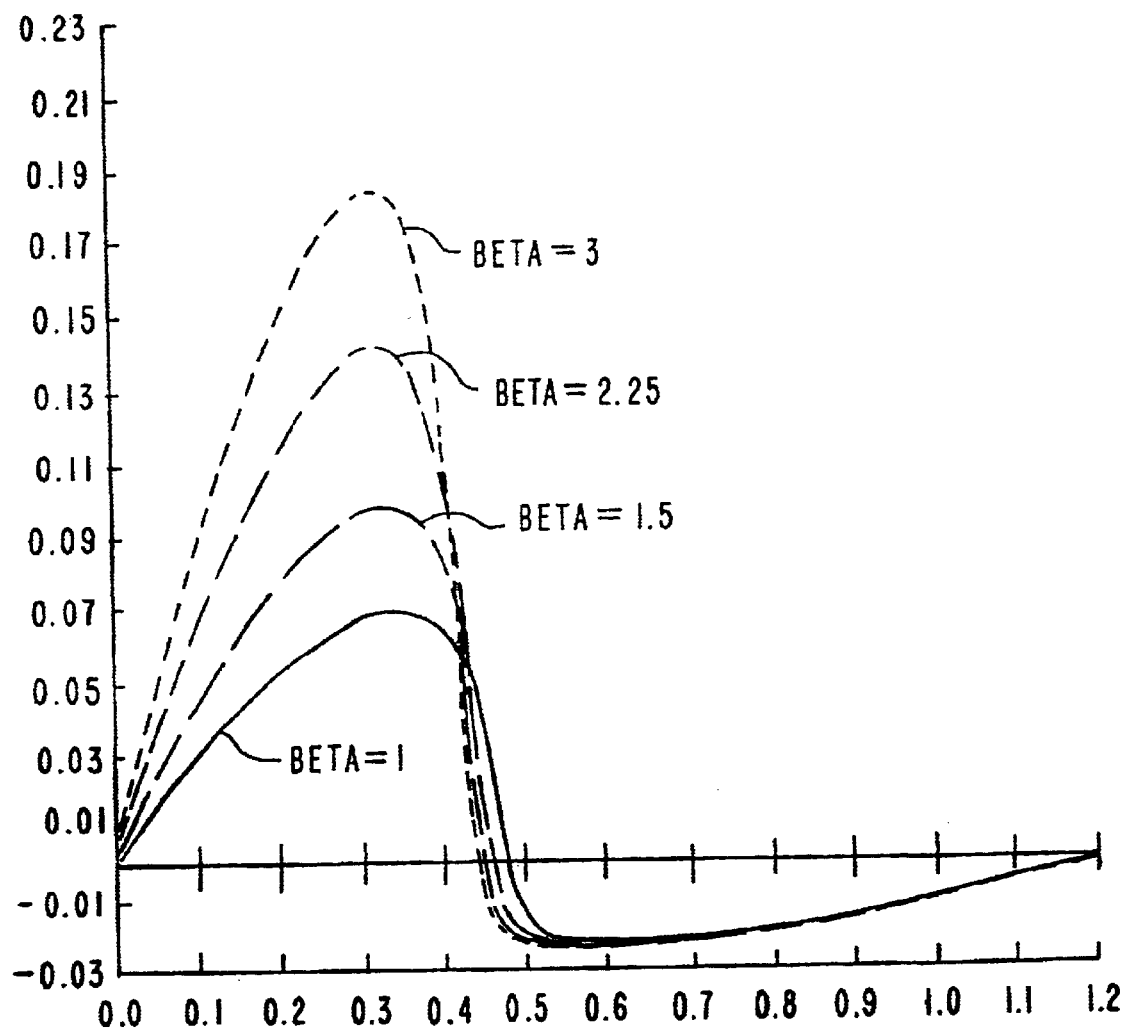
FIGS. 4A–C are examples of n-curves for SRAM cells.
Figure 4B:
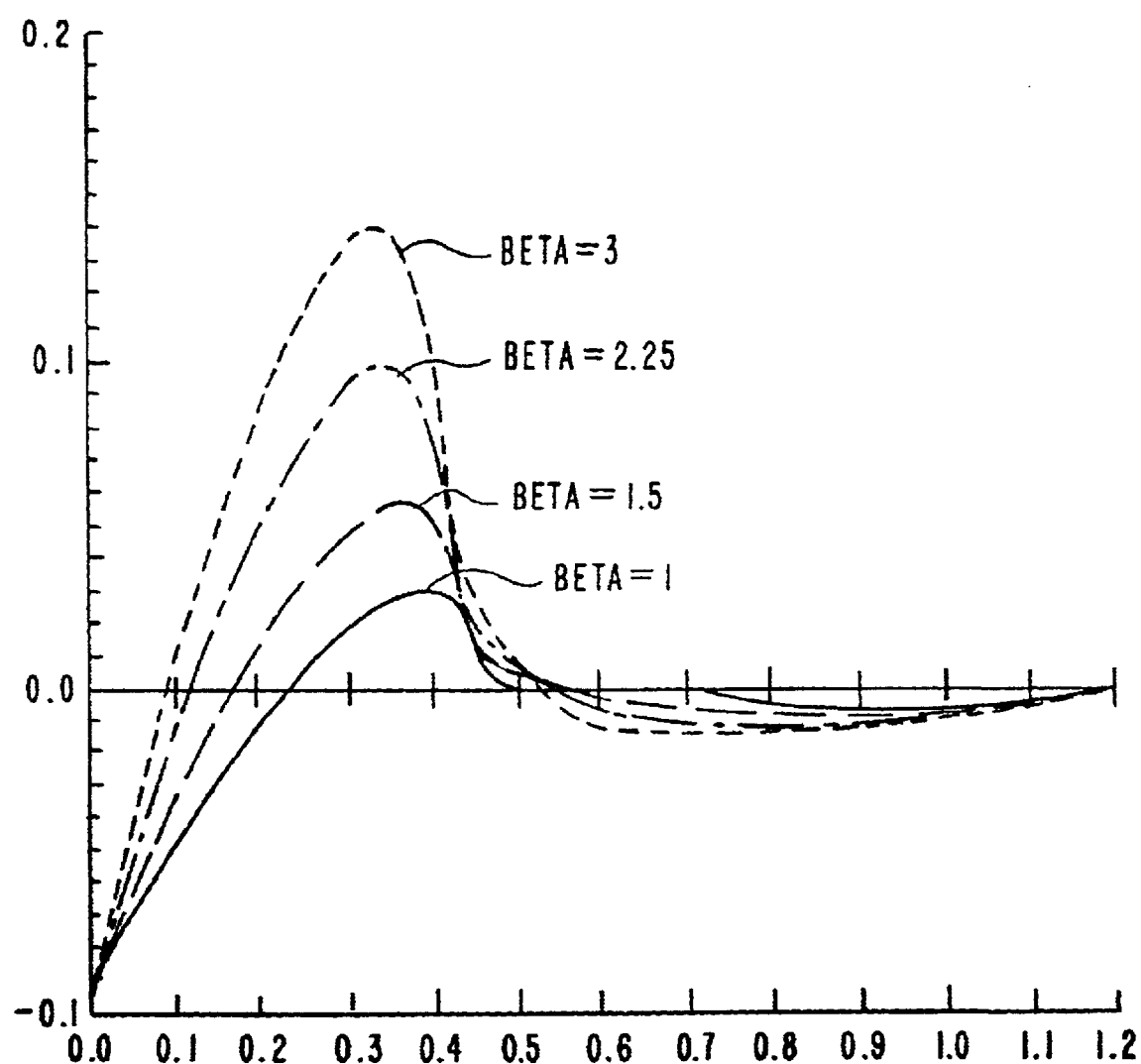
Figure 4C:
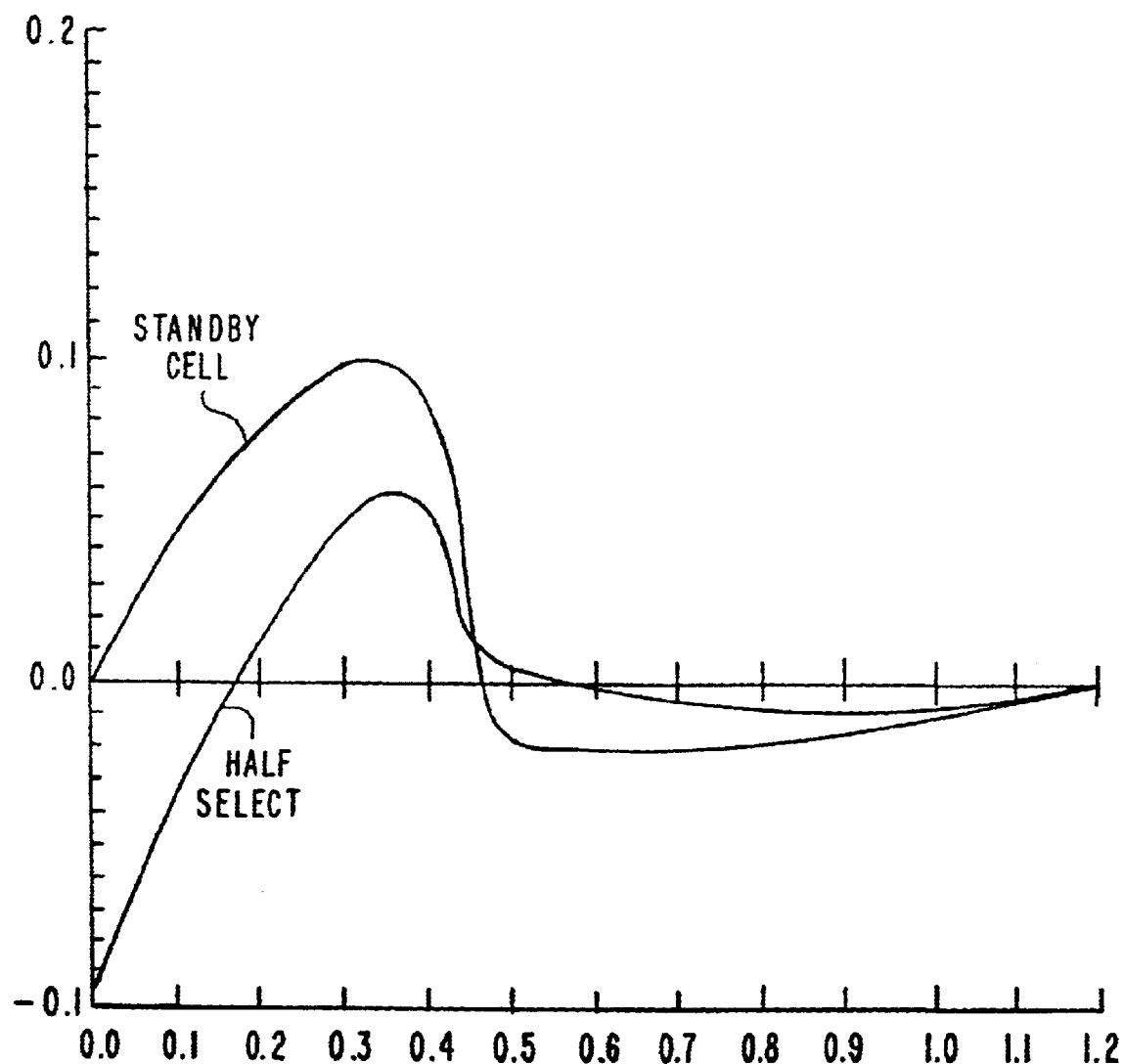

A noise curve (n-curve) that indicates SRAM cell stability and noise margin can be generated by plotting current versus voltage as one cross coupled latch node is ramped to a supply voltage, e.g., ground or $V_{dd}$. FIGS. 4A–C are examples of n-curves for SRAM cells, such as the cell 50 of FIG. 2 above, illustrating the effect of different design parameters within the cell, including β ratio and $V_{cc}$. Thus, FIG. 4A is illustrative of the effect of β ratio on cell stability for an off cell, i.e., where the word line is held low. From this example, it may be surmised that β ratio has little effect on soft error rate, e.g., from alpha particles. This is because SRAM cells typically recover from an alpha particle hit with current from the PFET pull-up device of the cross coupled invertors. Thus, the protection provided against alpha particles is dependent mainly upon the amount of current available from a minimum size PFET, 22 μA in this example. The current noise margin ($I_{nm}$) is the P device current for the particular β ratio curve, e.g., 140 μA for β of 2.25. Further, the difference between the first intercept at zero and the second intercept immediately following the peak current, defines the cell's voltage noise margin. So, at β=2.25 in this example, the voltage noise margin is 0.47V.

FIG. 4B shows an example of half select noise margin. Thus, as can be seen from this example, both the voltage noise margin and current noise margin is significantly degraded by half selecting cells. In particular, where cell β ratio is 2.25, the current noise margin is 100 μA and the voltage noise margin is approximately 0.42V. FIG. 4C is a comparison of standby and versus half select with the beta fixed at 1.5 and with both $V_{cc}$ and the word line (when selected) at 1.2V.

So, according to the preferred embodiment of the present invention, under conditions where soft errors or soft failures are more likely to occur, e.g., during long periods of stand-by or low power, sensitive data is moved from the low β array portion 104 and stored in the more stable high β ratio array portion 106. During normal operation, when soft errors are more easily addressed or are less likely to accumulate, data is in the high performance low power array 104. Thus, because during stand-by sensitive data has been transferred to the more stable, higher β ratio array portion 106, the lower β ratio array portion 104 may be operated at reduced power or at no power, to achieve substantial power savings. When power and stability are not at a premium, data is stored in the low β ratio, high performance array portion 104 to maximize SRAM performance. Optionally, sensitive data may be stored in the more stable high β ratio array 104 normally and, simultaneously into the low ratio array 104 or, subsequently transferred there, prior to entering standby. Returning the SRAM from stand-by is accomplished by reversing this intra-array read/write process to restore data from the high β ratio portion 106 to appropriate locations in the low β ratio portion 104.

Figure 5:
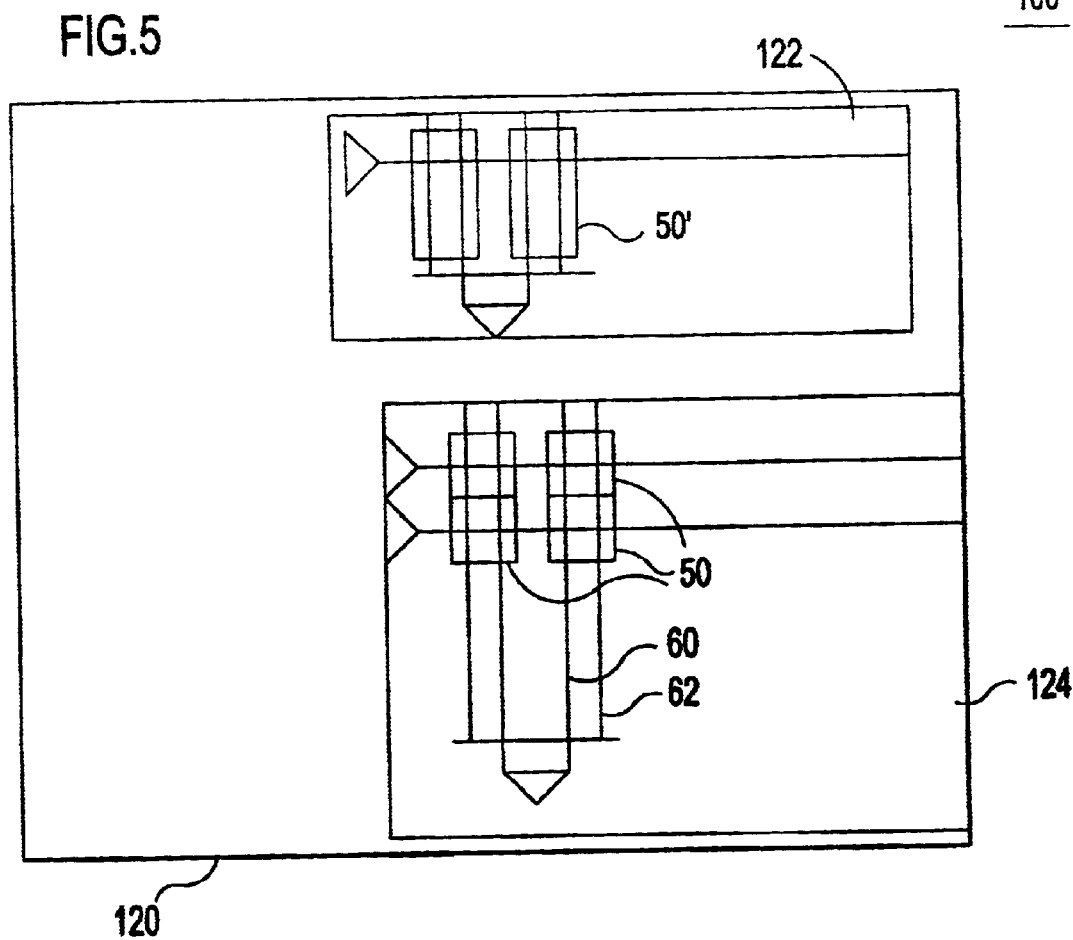
FIG. 5 shows another preferred embodiment physically similar to the first preferred embodiment.

FIG. 5 shows another preferred embodiment 120, organized differently, but physically similar to the first preferred embodiment. In this embodiment 120, individual high cell β ratio and low cell β ratio SRAM macros 122, 124 are included. Each macro 122, 124 is more or less self contained and, includes its own word line decoders and drivers, bit line decoders and drivers, as well as sense amps. As with the first embodiment, during normal operation the slower high β ratio array 122 is largely unused and the higher performance lower β ratio macro 124 is employed normally. Again, just prior to entering low power or stand-by mode, sensitive data is transferred from the low β ratio array 124 to the high β ratio array 122 with an inter-macro read-write operation. Optionally, during stand-by or at low power, the unused lower β ratio array 124 may be disconnected from its power supply to further reduce stand-by power requirements. Preferably, in this embodiment the β ratio of cells in the lower β ratio macro 124 is 1.5–2, while the β ratio of cells in the higher β ratio macro 122 is 2–4.

Figure 6:
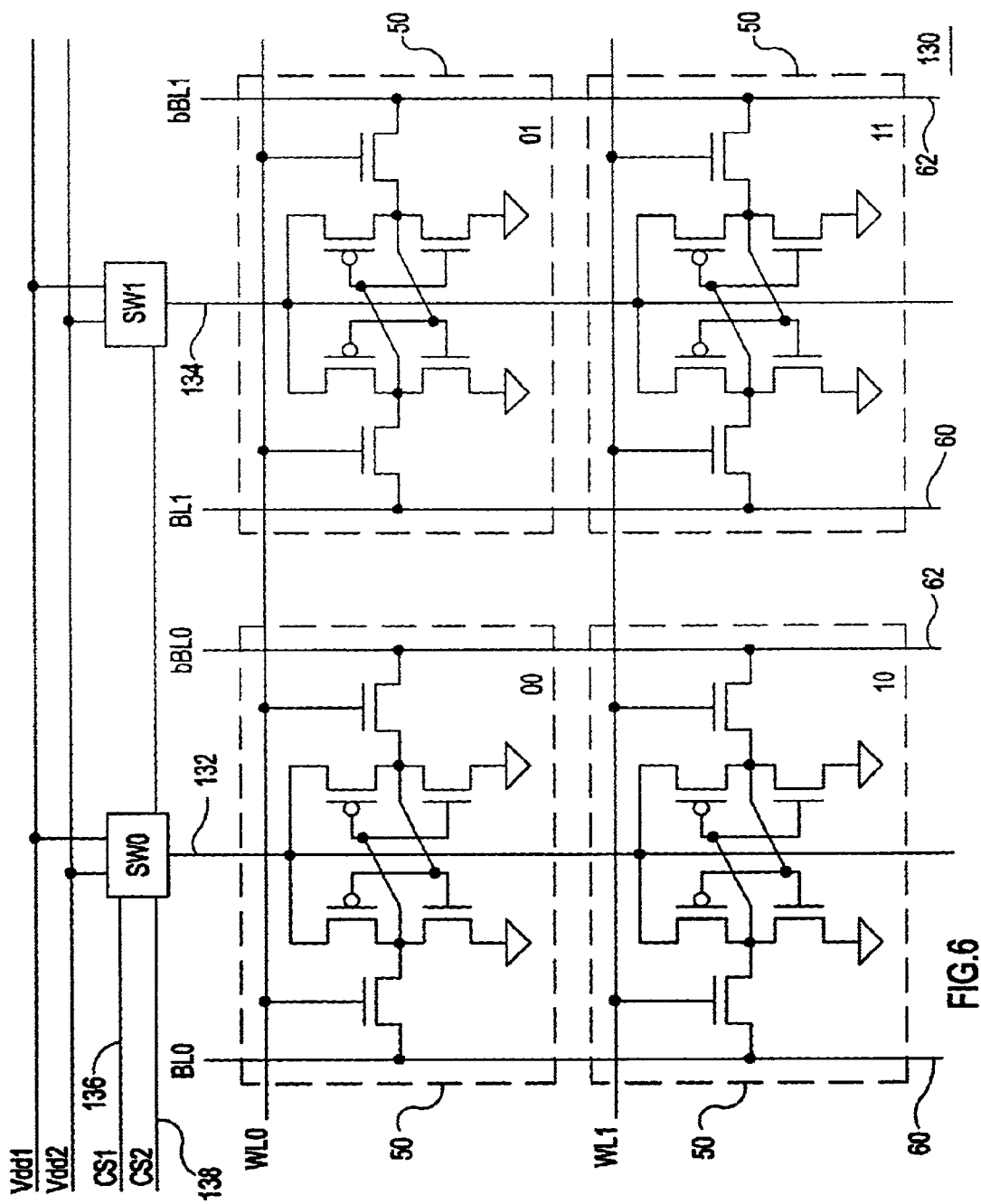
FIG. 6 is an example of a cross section of a third preferred embodiment wherein all cells have the same β ratio by design but, are operated such that cells being accessed have a lower effective β ratio than unselected cells.

FIG. 6 is an example of a cross section 130 of a third preferred embodiment wherein all cells 50 have the same β ratio by design but, are operated such that cells 50 being accessed have a lower effective β ratio than unselected and half selected cells 50. Thus, the entire array of this embodiment has the advantages of both array portions of the above embodiments in that any cells 50 selected for access have a low effective β ratio and exhibit high performance while other, unaccessed or half accessed cells 50 have a higher effective β ratio and exhibit higher stability. Although the architecture of this third preferred embodiment is substantially similar to either of the first two preferred embodiments, this preferred embodiment does have some unique differences.

In particular, none of the cells 50 in the array are physically different. However, the column decoder is slightly different than that of the first two embodiments. Primarily, for each column of cells the supply voltage ($V_{cc}$) 132, 134 is switchable and separate from every other column of cells in the array. So, in addition to normally selecting one pair of a number of pairs of pass gates at each column, the supply voltage for the column is also selected by column selection, 136, 138. Coincident with turning on a selected pair of pass gates for the selected column to pass the voltage difference on the selected bit line pair to a bit sense amp, the selected supply voltage is passed to the column supply $V_{cc}$ for the selected column.

The column select selects between chip supply $V_{dd1}$, and a second higher array supply $V_{dd2}$, which are provided to a supply voltage switch, one for each column of the array. Normally, the supply voltage switch selectively passes the higher array $V_{dd2}$ to $V_{cc}$ for unselected or half selected cells. However, upon selecting a column line, the lower chip $V_{dd1}$ is passed only to $V_{cc}$ for the selected column. The lower chip $V_{dd1}$, reduces the cell drive voltage, i.e., provided to the gate of the pull down NFET in the cell, such that pull down NFET on-resistance of cells in the selected column is reduced. Because of the reduced drive voltage, cells in the selected column have an effective β ratio that is lower than other cells in other unselected columns of the array. As noted above, the lower effective β ratio makes the write operation much quicker. The remaining half-selected cells with the higher $V_{cc}$ have a more stable, higher β ratio.

FIG. 7 is an example of a timing diagram for the reading and writing from a third preferred embodiment array as in FIG. 6. Data is written into a selected cell, placing the data on the bit line pair of the selected column by driving one side of the pair low with the other of the pair remaining high. Simultaneously, $V_{cc}$ is switched to lower $V_{dd1}$ for that selected column. Then, the selected word line is raised, connecting the cells on that word line with their respective bit line pairs. All of the half selected bit line pairs are precharged to $V_{dd1}$, while the column supply voltage $V_{cc}$ for all of those unselected columns remains at the higher $V_{dd2}$, thereby maintaining a high β ratio in those half selected cells. The bit line pairs on the unselected columns are disturbed somewhat during the period that the word line remains high, because the word line connects half selected cell storage latches to their respective bit line pairs. However, the selected cell is written quickly because the selected cells have a low β ratio and, therefore, the total path resistance is reduced through the pass gates and cell storage latches. As with the write, when data is read from a selected cell, the column select that selects a bit line pair simultaneously passes the lower $V_{dd2}$ to the column that includes the selected cell. When the word line is driven high to select the cell, the selected cell pulls one bit line of the pair low. The half selected cells are provided with the higher supply voltage for improved stability and, cells sharing the column with the accessed cell are provided with a reduced supply voltage for improved write performance.

In what is known as bulk CMOS technology, where devices are formed on the surface of a silicon layer, 1.5 is generally accepted as a minimum safe β ratio for a SRAM cell. A cell with a beta ratio of 1.0 is useful only where half select is not likely to occur. Half selects are most likely to occur along an active word line of, for example, a thousand cells when only a few, e.g., 32 bits of the 1,000, are being accessed. Alpha particles and other disturbs may occur in half selected cells that, under the wrong circumstances, may cause the cell to switch its state thereby causing soft errors. Silicon on insulator (SOI) CMOS cell β ratios must be approximately 50% more than in bulk CMOS, e.g., at least 2.25 for a SOI CMOS SRAM cell. Further, that β ratio must almost double to achieve adequate stability. Once the cell β ratio is high enough, however, the half selected cells ignore disturbs and imbalances and so, do not switch, regardless of how long the word line remains high. Thus, for example, the third preferred embodiment may be used to facilitate migration of an SRAM design and layout from bulk CMOS to SOI simply by modifying the array such that a higher supply voltage is provided in half selected portion of the array, i.e., an array supply voltage that is higher than the word line voltage for an effective increase in the β ratio for the half selected cells.

Figure 8A:
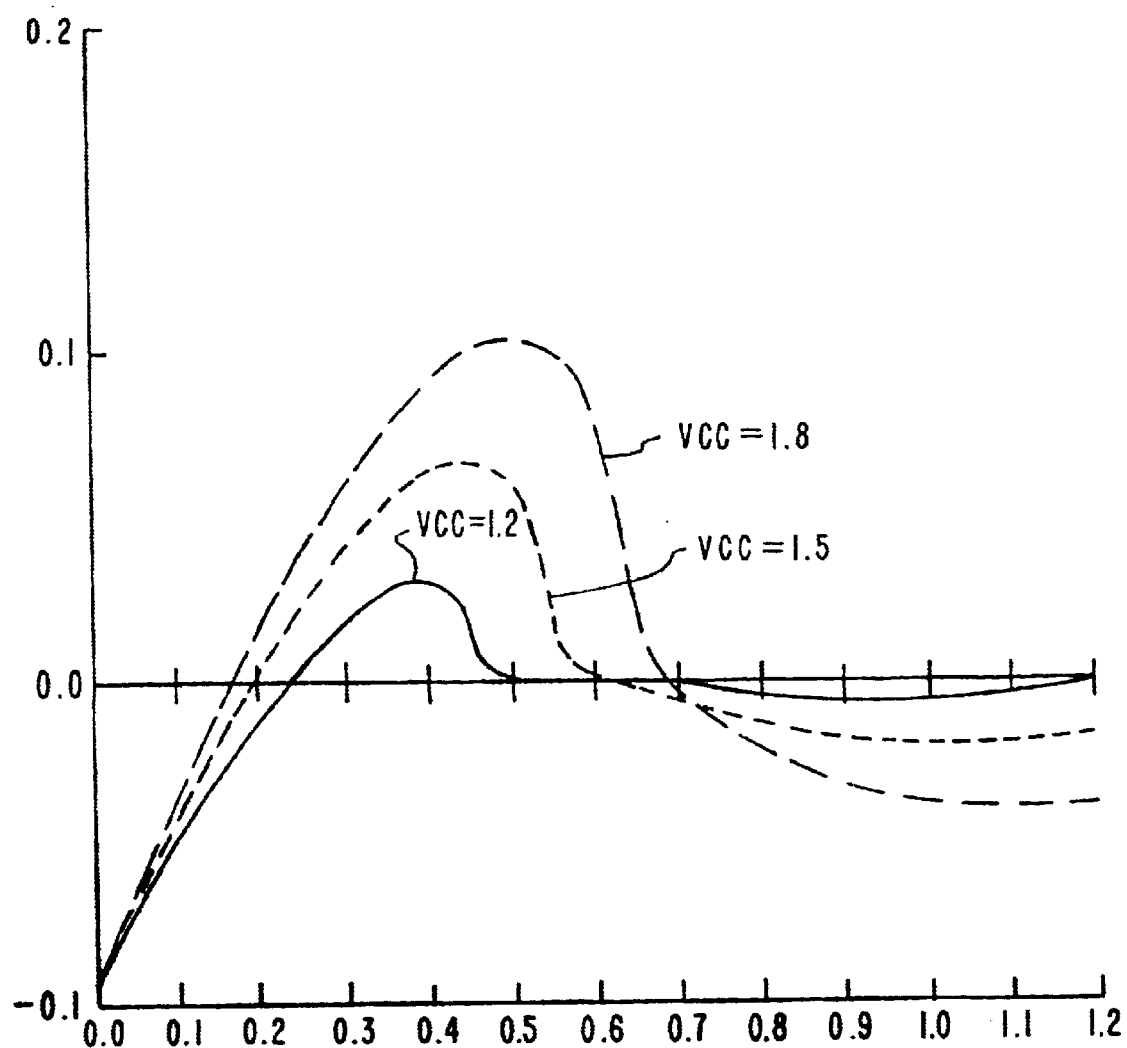
FIGS. 8A–C show n-curves illustrating the advantages of the third preferred embodiment from providing higher $V_{cc}$ to the half selected array cells.
Figure 8B:
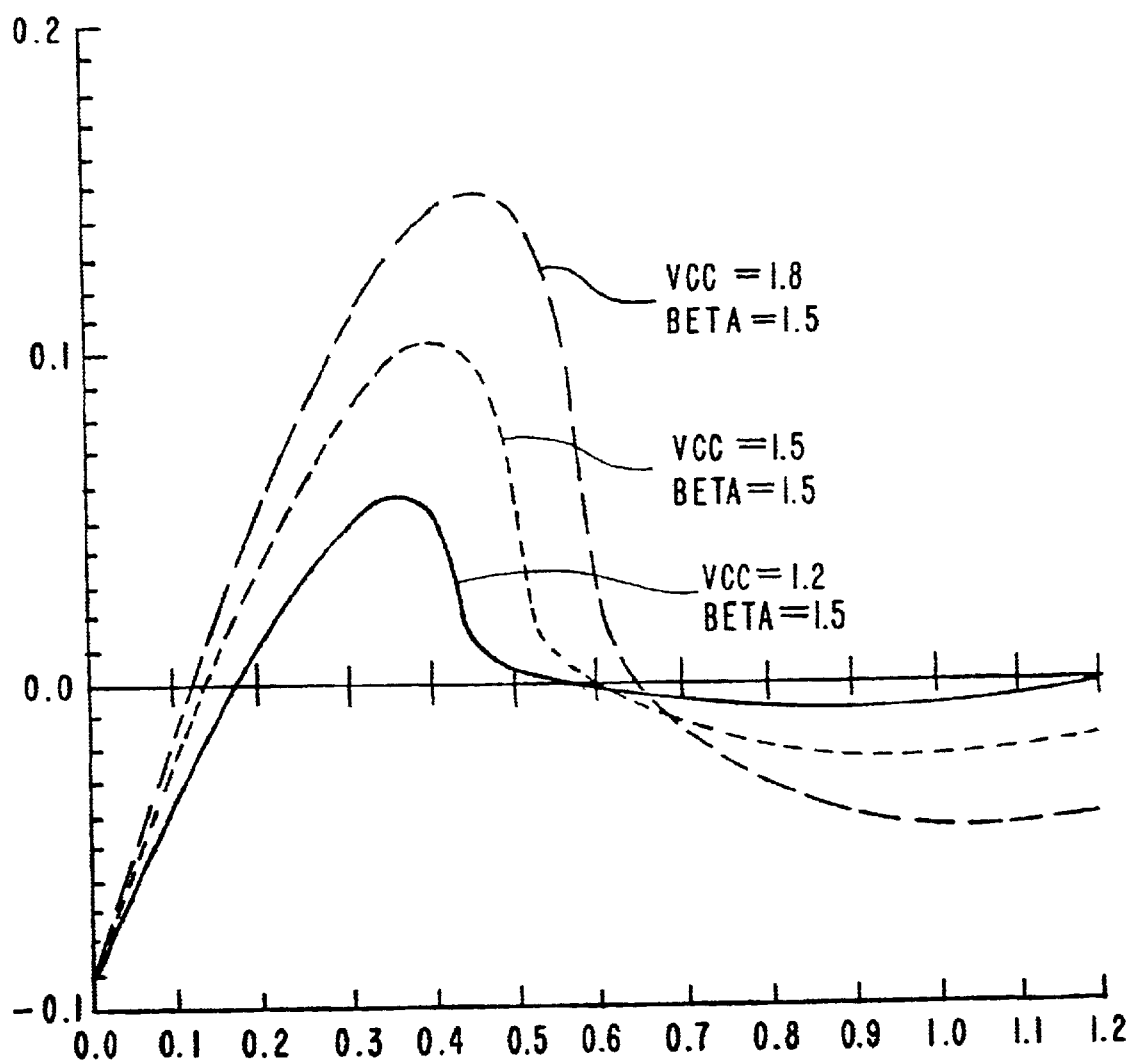
Figure 8C:
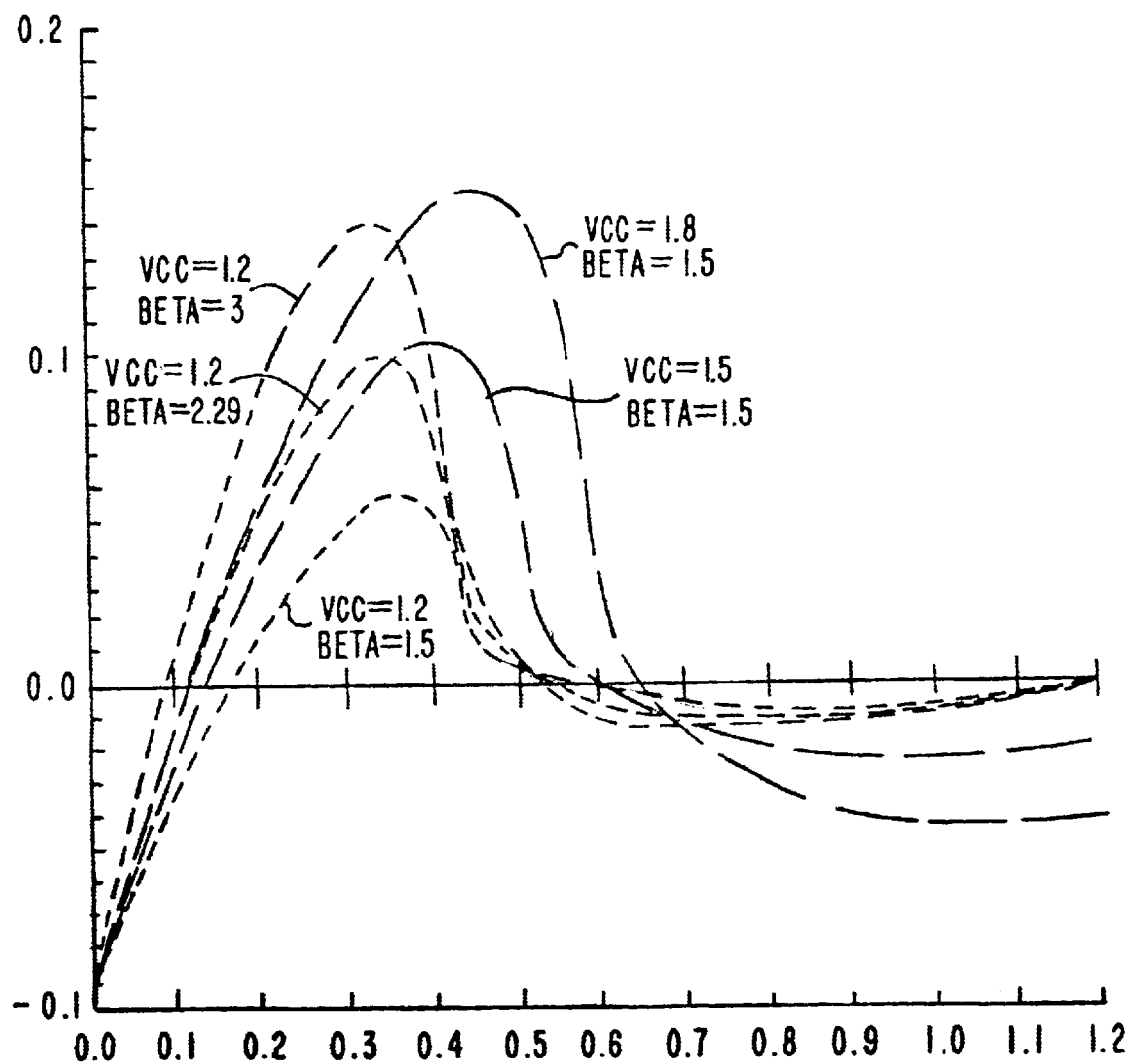

FIG. 8A shows n-curves illustrating the advantages of the third preferred embodiment from providing higher $V_{cc}$ to the half selected array cells. In particular, for a word line voltage of 1.2V with β fixed at 1, the current noise margin is improved from slightly more than 30 μA at $V_{cc}$ of 1.2V to roughly 110 μA with $V_{cc}$ at 1.8V and, correspondingly, almost a 2X voltage margin improvement from 0.28V to 0.52V. This compares with a β ratio of more than 2.25 in FIG. 4A. FIG. 8B shows a similar half select example wherein cell β ratio is 1.5 by design and $V_{cc}$ is varied from 1.2V to 1.8V, while holding the word line voltage at 1.2V. In this example, the current noise margin is improved from 50 μA at $V_{cc}$ of 1.2V to more than 160 μA at $V_{cc}$ of 1.8V. FIG. 8C shows a common overlay for comparing the curves of FIG. 4B with those of FIG. 8B.

Accordingly, a preferred embodiment SRAM of the present invention and, more particularly, the SRAM of the third preferred embodiment provides much more stability and soft error tolerance than typical state of the art SRAMs. More particularly, the present invention provides the same advantages that may be achieved, for example, using a high threshold implant to increase word line pass gate transistor thresholds. However, adding high threshold devices requires additional masks and implant steps. Instead, the present invention achieves this improvement at a significantly shorter manufacturing time and lower cost than what is incurred for adding masks and process steps. Also, using this third preferred embodiment, it is possible to migrate bulk CMOS SRAM designs almost directly from bulk CMOS to SOI, a heretofore unavailable migration path. In addition, the minimum SRAM cell need not have a β ratio of 1.5 but, instead, a β ratio of 1 or less may be suitable, advantageously shrinking minimum acceptable cell size.

Also, providing a switchable or controllable $V_{cc}$ allows independent control of array performance, standby power dissipation and soft error rate. Soft errors have become much more of a problem as cells store less charge. Charge, q=CV, is reduced as chip supply voltages are lowered along with cell capacitances and, in particular, parasitic capacitances within the cell. Both C and V are reduced as a natural result of migrating from bulk CMOS technology to SOI. So, migrating from bulk CMOS to SOI increases cell sensitivity to soft errors. As can be seen from the above n-curves, cells with a higher β ratio have much better noise margins and, accordingly, soft error rate tolerance as well as higher half-select noise margin. Thus, by achieving higher effective β ratios without forgoing cell density, the third preferred embodiment enjoys significant advantages over the prior art approaches.

Having thus described preferred embodiments of the present invention, various modifications and changes will occur to a person skilled in the art without departing from the spirit and scope of the invention. It is intended that all such variations and modifications fall within the scope of the appended claims. Examples and drawings are, accordingly, to be regarded as illustrative rather than restrictive.

What is claimed is:

1. A static random access for memory (SRAM) comprising:
   an array of SRAM cells, a first array portion including said SRAM cells having a first beta ratio for performance and density; and
   a second array portion including SRAM cells having a second beta ratio higher than said first beta ratio, cells of said second array portion being more stable than cells of said first array portion.

2. A SRAM as in claim 1 wherein said first beta ratio is between 1 and 3 and said second beta ratio is between 2 and 4.

3. A SRAM as in claim 2 wherein said first beta ratio is between 2 and 3 and said second beta ratio is between 3 and 4.

4. A SRAM as in claim 1 wherein said first array portion and said second array portion are in a common SRAM array, whereby sensitive data is selectively transferred between said first array portion and said second array portion depending upon a need for additional stability or performance.

5. A SRAM as in claim 1 wherein said first array portion is in a first SRAM macro and said second array portion is in a second SRAM macro, whereby sensitive data is selectively transferred between said first array portion and said second array portion depending upon a need for additional stability or performance.

6. A SRAM as in claim 1 wherein during access of cells of said memory array, SRAM cells in each column being accessed having said first beta ratio, remaining SRAM cells in said array having said second beta ratio.

7. A SRAM as in claim 1 further comprising a word decode selecting one word line amongst a plurality of word lines, each selected word line selecting a plurality of SRAM cells; and
   a column select for selecting a column amongst a plurality of columns a cell at a selected column and word line being accessed.

8. A SRAM as in claim 7 wherein the column select further comprises a column supply voltage select, said column supply voltage select providing a first voltage level to an unselected column and a second voltage supply level to a selected column whereby said second supply voltage provides a lower effective beta ratio to cells in said column than said first supply voltage.

9. A SRAM as in claim 7 wherein said word decode is a first word decode selecting word lines in said first array portion and further comprising a second word decode selecting word lines in said second array portion.

10. A SRAM as in claim 9 wherein said column decode is a first column decode selecting columns in said first array portion and further comprising a second column decode selecting columns in said secondary portion, said first array portion being in a first SRAM macro and said second array portion being in a second SRAM macro.

11. A static random access for memory (SRAM) comprising:
    an array of SRAM cells, a first array portion including said SRAM cells having a first beta ratio for performance and density;
    a second array portion including SRAM cells having a second beta ratio higher than said first beta ratio, cells of said second array portion being more stable than cells of said first array portion;
    a word decode selecting one word line amongst a plurality of word lines, each selected word line selecting a plurality of SRAM cells from said array; and
    a column select for selecting a column amongst a plurality of columns, a cell at a selected column and word line being accessed.

12. A SRAM as in claim 11 wherein said first beta ratio is between 1 and 3 and said second beta ratio is between 2 and 4.

13. A SRAM as in claim 12 wherein said first beta ratio is between 1.5 and 2.

14. A SRAM as in claim 13 wherein the column select further comprises a column supply voltage select, said column supply voltage select providing a first voltage level to an unselected column and a second voltage supply level to a selected column whereby said second supply voltage provides a lower effective beta ratio to cells in said column than said first supply voltage.

15. A SRAM as in claim 13 wherein said word decode is a first word decode selecting word lines in said first array portion and further comprising a second word decode selecting word lines in said second array portion, whereby sensitive data is selectively transferred between said first array portion and said second array portion depending upon a need for additional stability or performance.

16. A SRAM as in claim 15 wherein said column decode is a first column decode selecting columns in said first array portion and further comprising a second column decode selecting columns in said secondary portion, said first array portion being in a first SRAM macro and said second array portion being in a second SRAM macro.

17. A static random access for memory (SRAM) comprising:
    an array of SRAM cells, a first array portion including said SRAM cells having a first beta ratio for performance and density;
    a second array portion including SRAM cells having a second beta ratio higher than said first beta ratio, cells of said second array portion being more stable than cells of said first array portion;
    a word decode selecting one word line amongst a plurality of word lines, each selected word line selecting a plurality of SRAM cells from said array;
    a column select for selecting a column amongst a plurality of columns, a cell at a selected column and word line being accessed; and
    a column supply voltage select, said column supply voltage select providing a first voltage level to an unselected column and a second voltage supply level to a selected column whereby said second supply voltage provides a lower effective beta ratio to cells in said column than said first supply voltage.

18. A SRAM as in claim 17 wherein said first beta ratio is between 1 and 3 and said second beta ratio is between 2 and 4.

19. A SRAM as in claim 18 wherein said first beta ratio is between 1.5 and 2.

20. A SRAM as in claim 19 wherein said column select selects said column supply voltage.

21. A static random access for memory (SRAM) comprising:
    an array of SRAM cells, a first array portion including said SRAM cells having a first beta ratio for performance and density;
    a second array portion including SRAM cells having a second beta ratio higher than said first beta ratio, cells of said second array portion being more stable than cells of said first array portion;
    a first word decode selecting one word line amongst a plurality of word lines, each selected word line selecting a plurality of SRAM cells from said array;
    a column select for selecting a column amongst a plurality of columns, a cell at a selected column and word line being accessed; and
    a second word decode selecting one word line amongst a plurality of word lines in said second array portion, whereby sensitive data is selectively transferred between said first array portion and said second array portion depending upon a need for additional stability or performance.

22. A SRAM as in claim 21 wherein said first beta ratio is between 1 and 3 and said second beta ratio is between 2 and 4.

23. A SRAM as in claim 22 wherein said first beta ratio is between 1.5 and 2.

24. A SRAM as in claim 21 wherein said column decode is a first column decode selecting columns in said first array portion and further comprising a second column decode selecting columns in said second array portion, said first array portion being in a first SRAM macro and said second array portion being in a second SRAM macro.

25. A SRAM as in claim 24 wherein said first beta ratio is between 1 and 3 and said second beta ratio is between 2 and 4.

26. A SRAM as in claim 25 wherein said first beta ratio is between 1.5 and 2.

* * * * *